(12) United States Patent
Chen et al.

(10) Patent No.: US 11,261,305 B2
(45) Date of Patent: Mar. 1, 2022

(54) THERMOSETTING RESIN COMPOSITION, PREPREG, LAMINATE, AND PRINTED CIRCUIT BOARD

(71) Applicant: Shengyi Technology Co., Ltd., Guangdong (CN)

(72) Inventors: Guangbin Chen, Guangdong (CN); Qianfa Liu, Guangdong (CN); Shanyin Yan, Guangdong (CN); Xianping Zeng, Guangdong (CN); Cuiming Du, Guangdong (CN)

(73) Assignee: SHENGYI TECHNOLOGY CO., LTD., Guangdong (CN)

( * ) Notice: Subject to any disclaimer, the term of this patent is extended or adjusted under 35 U.S.C. 154(b) by 0 days.

(21) Appl. No.: 16/523,753

(22) Filed: Jul. 26, 2019

(65) Prior Publication Data
US 2020/0247970 A1    Aug. 6, 2020

(30) Foreign Application Priority Data

Feb. 2, 2019    (CN) .......................... 201910108580.9

(51) Int. Cl.
| | |
|---|---|
| *C08J 5/24* | (2006.01) |
| *B32B 15/14* | (2006.01) |
| *C08L 25/10* | (2006.01) |
| *C08L 47/00* | (2006.01) |
| *C08L 71/12* | (2006.01) |
| *H05K 1/03* | (2006.01) |

(52) U.S. Cl.
CPC .................. *C08J 5/24* (2013.01); *B32B 15/14* (2013.01); *C08L 25/10* (2013.01); *C08L 47/00* (2013.01); *C08L 71/12* (2013.01); *H05K 1/0373* (2013.01); *B32B 2260/046* (2013.01); *B32B 2457/08* (2013.01); *C08J 2325/10* (2013.01); *C08J 2347/00* (2013.01); *C08J 2371/12* (2013.01); *C08J 2425/10* (2013.01); *C08J 2447/00* (2013.01); *C08J 2471/12* (2013.01); *C08L 2201/02* (2013.01); *C08L 2203/20* (2013.01); *H05K 2201/012* (2013.01); *H05K 2201/0158* (2013.01); *H05K 2201/0209* (2013.01)

(58) Field of Classification Search
CPC ...... C08J 5/24; C08J 2325/10; C08J 2347/00; C08J 2371/12; C08J 2425/10; C08J 2447/00; C08J 2471/12; B32B 15/14; B32B 2260/046; B32B 2457/08; C08L 25/10; C08L 47/10; C08L 71/12; C08L 2201/02; C08L 2203/20; H05K 1/0373; H05K 2201/012; H05K 2201/0158; H05K 2201/0209
USPC ......................................................... 525/107
See application file for complete search history.

(56) References Cited

U.S. PATENT DOCUMENTS

| | | | |
|---|---|---|---|
| 8,524,806 B2 | 9/2013 | Matthijssen | |
| 2015/0030824 A1 | 1/2015 | Crosley | |
| 2016/0319129 A1* | 11/2016 | Song | ........................ C08L 71/12 |
| 2020/0283615 A1 | 9/2020 | Umehara | |

FOREIGN PATENT DOCUMENTS

| | | | | |
|---|---|---|---|---|
| CN | 102304264 A | | 1/2012 | |
| CN | 103379989 A | | 10/2013 | |
| CN | 105453705 A | | 3/2016 | |
| CN | 105793358 A | * | 7/2016 | ............ C08L 71/126 |
| CN | 105793358 A | | 7/2016 | |
| CN | 109233244 A | * | 1/2019 | |
| CN | 109233244 A | | 1/2019 | |
| JP | 2017128718 A | | 7/2017 | |

OTHER PUBLICATIONS

Extended European Search Report, dated Dec. 2, 2019, in European Application No. 19184689.8.
Office Action dated Nov. 26, 2020 in Chinese Patent Application No. 2019101085809.
Wang et al., Polymeric Nanocomposite, Northwest Polytechnical University Press, 2017.

* cited by examiner

*Primary Examiner* — Ling Siu Choi
*Assistant Examiner* — Ronald Grinsted
(74) *Attorney, Agent, or Firm* — Knobbe, Martens, Olson & Bear LLP

(57) ABSTRACT

A thermosetting resin composition, a prepreg, a laminate, and a printed circuit board are provided. The thermosetting resin composition has a thermosetting polyphenylene ether resin, an unsaturated polyolefin resin, a curing agent, and hollow borosilicate microspheres with surfaces treated with a bromine-containing silane coupling agent. The laminate produced from the thermosetting resin composition satisfies the requirements for overall properties such as low dielectric constant, low dielectric loss, low water absorption rate, high peeling strength, and the like for a high-frequency electronic circuit substrate.

17 Claims, No Drawings

THERMOSETTING RESIN COMPOSITION, PREPREG, LAMINATE, AND PRINTED CIRCUIT BOARD

PRIORITY AND CROSS REFERENCE OT RELATED APPLICATIONS

This application claims the benefit of priority to Chinese Application No. 201910108580.9, filed on Feb. 2, 2019, which is hereby incorporated by reference in its entirety.

TECHNICAL FIELD

This disclosure relates to the technical field of laminates, and particularly to a thermosetting resin composition, a prepreg, a laminate, and a printed circuit board, which are used for a high-frequency electronic circuit.

BACKGROUND ART

With the development of fifth-generation (5G) communication technology, there are higher requirements for overall properties of electronic circuit substrates (laminates, sometimes also referred to as metal-clad plates such as copper-clad plates) used for high frequency. With respect to critical properties such as dielectric constant and dielectric loss of substrates, requirements for various specifications are proposed. Design and development of high-frequency electronic circuit substrates having low dielectric constant and low dielectric loss will be an important field of research and development with respect to manufacturers for manufacturing metal-clad plates such as copper-clad plates at present and in the future.

Design and development of high-frequency electronic circuit substrates having low dielectric constant and low dielectric loss using a low-polarity thermosetting resin are an important technical scheme of research and development with respect to various manufacturers for manufacturing copper-clad plates at present.

The polyolefin resin has excellent properties of low dielectric constant and low dielectric loss, and has been widely used in high-frequency electronic circuit substrates. However, the resin has a poor flame retardancy, and a large amount of flame retardant is required to be added to achieve a V-0 flame retardancy of a high-frequency electronic circuit substrate. However, the addition of a large amount of flame retardant will lead to a reduced peeling strength of the substrate, and the requirements by customers cannot be satisfied. Therefore, it is a great challenge in design and development of a high-frequency electronic circuit substrate to use a polyolefin resin while a low dielectric constant/low dielectric loss and a high peeling strength of the substrate are achieved.

In order to obtain a high-frequency electronic circuit substrate having lower dielectric constant, it is a very effective means for technical achievement to add hollow glass microspheres.

Chinese Patent CN105453705A discloses a dielectric substrate layer, comprising about 30 to about 90 volume percent of a polymer matrix material; and about 5 to about 70 volume percent of hollow borosilicate microspheres, wherein the hollow borosilicate microspheres are a product of a process of subjecting the borosilicate microspheres to an alkaline solution; and wherein the dielectric substrate layer has a dielectric constant of less than about 3.5 and a dissipation factor of less than about 0.006 at 10 GHz.

However, the following problems exist for the above patent.

1. The dielectric substrate layer employs a polymer base material, including various resins such as 1,2-polybutadiene, polyisoprene, and the like. For example, in the case where 1,2-polybutadiene is used as a polymer base material of the dielectric substrate layer, a large amount of flame retardant is required to be added to achieve V-0 flame retardancy of the substrate due poor flame retardancy of the resin. However, the addition of a large amount of flame retardant will lead to a greatly reduced peeling strength of the substrate, and the requirements for the peeling strength property by customers cannot be satisfied.

2. The hollow borosilicate microspheres used are product subjected to treatment with an alkaline liquor. The treatment of the hollow borosilicate microspheres with an alkaline liquor is for the purpose of the reduction of the content of sodium ions in the hollow borosilicate microspheres and the reduction of the dielectric loss of the substrate produced. A step of treating with an alkaline liquor is required in the production of the hollow borosilicate microspheres, and there is a problem that the alkaline liquor used is required to be further treated. Furthermore, the dielectric constant and the dielectric loss of the dielectric substrate layer described above may also be achieved by using another hollow borosilicate microspheres which are not treated with an alkaline liquor.

3. The hollow borosilicate microspheres used are hollow microspheres whose surfaces are not subjected to coating treatment. The substrate produced has problems of high water absorption rate and increased dielectric loss of the substrate.

SUMMARY

Therefore, it is desirable to provide a thermosetting resin composition, a prepreg, a laminate, and a printed circuit board, which are used for a high-frequency electronic circuit. The laminate produced from the thermosetting resin composition may satisfy the requirements for overall properties such as low dielectric constant, low dielectric loss, low water absorption rate, high peeling strength, and the like by a high-frequency electronic circuit substrate.

Through intensive and detailed studies, the inventor of this disclosure has found that by adding hollow borosilicate microspheres with surfaces treated with a bromine-containing silane coupling agent to a thermosetting resin composition comprising a thermosetting polyphenylene ether resin and an unsaturated polyolefin resin, it is possible to allow the distribution of the bromine element in the resin system to be more uniform and improve the flame retarding efficiency. Therefore, in the case where the V-0 flame retardancy of the substrate is achieved, it is possible to reduce the proportion of bromine-containing flame retardant used and improve the peeling strength of the substrate so as to satisfy the requirements for the peeling strength of the substrate by customers. Furthermore, by performing surface treatment on hollow borosilicate microspheres with a bromine-containing silane coupling agent, it is possible to reduce the water absorption rate of the hollow borosilicate microspheres and the problem that the dielectric loss of the substrate produced is increased due to the water absorption of the hollow borosilicate microspheres will not occur. Therefore, this disclosure has been achieved.

In one aspect, this disclosure provides a thermosetting resin composition, comprising the following components:
(1) a thermosetting polyphenylene ether resin;
(2) an unsaturated polyolefin resin;
(3) a curing agent; and
(4) hollow borosilicate microspheres with surfaces treated with a bromine-containing silane coupling agent.

According to one preferred embodiment of this disclosure, the hollow borosilicate microspheres with surfaces treated with a bromine-containing silane coupling agent are not treated with an alkaline liquor.

According to another preferred embodiment of this disclosure, the hollow borosilicate microspheres with surfaces treated with a bromine-containing silane coupling agent are obtained by treating chemically untreated hollow borosilicate microspheres with a bromine-containing silane coupling agent, wherein a content of the chemically untreated hollow borosilicate microspheres is 95% to 98% by weight with respect to the hollow borosilicate microspheres with surfaces treated with a bromine-containing silane coupling agent.

According to another preferred embodiment of this disclosure, the hollow borosilicate microspheres with surfaces treated with a bromine-containing silane coupling agent have an average particle diameter of no greater than 50 μm.

According to another preferred embodiment of this disclosure, the hollow borosilicate microspheres with surfaces treated with a bromine-containing silane coupling agent are 10 to 60 parts by weight with respect to 100 parts by weight of the sum of the thermosetting polyphenylene ether resin and the unsaturated polyolefin resin.

According to another preferred embodiment of this disclosure, the unsaturated polyolefin resin is 25 to 250 parts by weight with respect to 100 parts by weight of the thermosetting polyphenylene ether resin.

According to another preferred embodiment of this disclosure, the curing agent is 1 to 3 parts by weight with respect to 100 parts by weight of the sum of the thermosetting polyphenylene ether resin and the unsaturated polyolefin resin.

According to another preferred embodiment of this disclosure, the thermosetting polyphenylene ether resin is represented by the following formula (1):

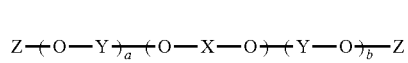
(1)

in formula (1), a and b are each independently an integer of 1 to 30,
Z is a group represented by formula (2) or (3)

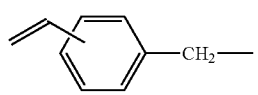
(2)

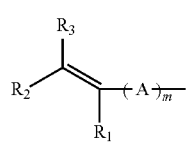
(3)

in formula (3), A is an arylene group having a carbon atom number of 6 to 30, a carbonyl group, or an alkylene having a carbon atom number of 1 to 10, m is an integer of 0 to 10, and $R_1$ to $R_3$ are each independently a hydrogen atom or an alkyl group having a carbon atom number of 1 to 10;

—(—O—Y—)— in formula (1) is a group represented by formula (4):

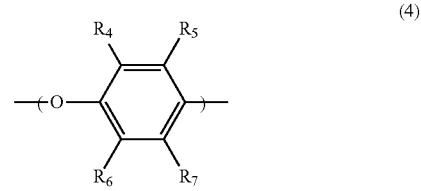
(4)

in formula (4), $R_4$ and $R_6$ are each independently a hydrogen atom, a halogen atom, an alkyl having a carbon atom number of 1 to 10 or phenyl group; and $R_5$ and $R_7$ are each independently a hydrogen atom, a halogen atom, an alkyl having a carbon atom number of 1 to 10 or phenyl group;

—(—O—X—O—)— in formula (1) is a group represented by formula (5):

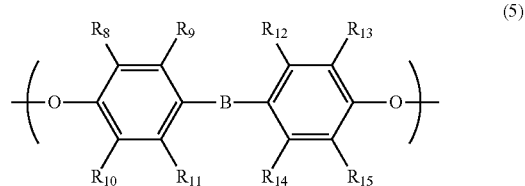
(5)

in formula (5), $R_8$, $R_9$, $R_{10}$, $R_{11}$, $R_{12}$, $R_{13}$, $R_{14}$ and $R_{15}$ are each independently a hydrogen atom, a halogen atom, an alkyl having a carbon atom number of 1 to 10 or phenyl group; and B is an alkylene group having a carbon atom number of 1 to 10, —O—, —CO—, —SO—, —CS—, or —$SO_2$—.

According to another preferred embodiment of this disclosure, the thermosetting polyphenylene ether resin has a number average molecular weight of 500-10000 g/mol.

According to another preferred embodiment of this disclosure, the unsaturated polyolefin resin is selected from one of a styrene-butadiene copolymer, polybutadiene, and a styrene-butadiene-divinylbenzene copolymer or a mixture of at least two thereof.

According to another preferred embodiment of this disclosure, the curing agent is a radical curing agent.

According to another preferred embodiment of this disclosure, the curing agent is an organic peroxide-based curing agent.

According to another preferred embodiment of this disclosure, the thermosetting resin composition further comprises a bromine-containing flame retardant.

According to another preferred embodiment of this disclosure, the bromine-containing flame retardant is selected from one of decabromodiphenyl ether, decabromodiphenyl ethane, and ethylene-bis(tetrabromophthalimide) or a mixture of at least two thereof.

In another aspect, this disclosure provides a prepreg, comprising a reinforcing material and the thermosetting resin composition according to any one described above attached thereon after impregnation and drying.

In still another aspect, this disclosure provides a metal foil-clad laminate, comprising: a sheet of the prepreg as described above and a metal foil clad on one side or both sides of the prepreg; or at least two sheets of laminated prepregs and a metal foil clad on one side or both sides of the laminated prepregs, wherein at least one sheet of the at least two sheets of the laminated prepregs is the prepreg as described above.

In yet another aspect, this disclosure provides a printed circuit board, comprising at least one sheet of the prepreg as described above.

According to this disclosure, there may be provided a thermosetting resin composition, a prepreg, a laminate, and a printed circuit board. By adding hollow borosilicate microspheres with surfaces treated with a bromine-containing silane coupling agent to a thermosetting resin composition comprising a thermosetting polyphenylene ether resin and an unsaturated polyolefin resin, it is possible to allow the distribution of the bromine element in the resin system to be more uniform and improve the flame retarding efficiency. Therefore, in the case where the V-0 flame retardancy of the substrate is achieved, it is possible to reduce the proportion of bromine-containing flame retardant used and improve the peeling strength of the substrate so as to satisfy the requirements for the peeling strength of the substrate by customers. Furthermore, by performing surface treatment on hollow borosilicate microspheres with a bromine-containing silane coupling agent, it is possible to reduce the water absorption rate of the hollow borosilicate microspheres and the problem that the dielectric loss of the substrate produced is increased due to the water absorption of the hollow borosilicate microspheres will not occur.

Furthermore, the hollow borosilicate microspheres used are fillers which are not treated with an alkaline liquor, so that the procedure of treatment with an alkaline liquor in the production process of the hollow borosilicate microspheres is reduced, the production efficiency is improved, and the production process is more environmentally friendly.

DETAILED DESCRIPTION

The technical solutions in the Examples of this disclosure will be described clearly and fully below in conjunction with specific embodiments of this disclosure. Obviously, the embodiments and/or Examples described are merely a part of the embodiments and/or Examples of this disclosure, rather than all of the embodiments and/or Examples. Based on the embodiments and/or Examples of this disclosure, all other embodiments and/or Examples obtained by those of ordinary skill in the art without performing inventive work belong to the scope protected by this disclosure.

In this disclosure, all characteristics of numeric values mean to be within an error range of measurement, for example within ±10%, within ±5%, or within ±1% of a defined numeric value.

Said "comprise", "include", or "contain" in this disclosure mean that there may be other components besides the components. These other components confer various characteristics to the prepreg. Additionally, said "comprise", "include", or "contain" in this disclosure may further comprise "substantially consist of", and can be replaced by "is" or "consist of".

In this disclosure, the amount, the ratio, and the like are based on weight, unless specifically indicated.

As described above, this disclosure may provide a thermosetting resin composition, comprising the following components:
(1) a thermosetting polyphenylene ether resin;
(2) an unsaturated polyolefin resin;
(3) a curing agent; and
(4) hollow borosilicate microspheres with surfaces treated with a bromine-containing silane coupling agent.

Hollow Borosilicate Microspheres with Surface Treated with Bromine-Containing Silane Coupling Agent In the thermosetting resin composition, the hollow borosilicate microspheres with surfaces treated with a bromine-containing silane coupling agent may be not treated with an alkaline liquor.

The hollow borosilicate microspheres with surfaces treated with a bromine-containing silane coupling agent are obtained by treating chemically untreated hollow borosilicate microspheres with a bromine-containing silane coupling agent, wherein a content of the chemically untreated hollow borosilicate microspheres is 95% to 98% by weight with respect to the hollow borosilicate microspheres with surfaces treated with a bromine-containing silane coupling agent.

Exemplary hollow borosilicate microspheres which are not treated with an alkaline liquor may be iM16K from 3M.

exemplary hollow borosilicate microspheres which are not treated with an alkaline liquor may be S38HS from 3M.

The bromine-containing silane coupling agent may be represented by formula $(BrR_{21})Si(OR_{22})(OR_{23})(OR_{24})$, wherein $R_{21}$ may represent an alkyl group having a carbon atom number of 1 to 10, and $R_{22}$, $R_{23}$, and $R_{24}$ each independently represent an alkyl group having a carbon atom number of 1 to 4. The alkyl group having a carbon atom number of 1 to 10 is preferably an alkyl group having a carbon atom number of 2 to 8, more preferably an alkyl group having a carbon atom number of 3 to 7, still more preferably an alkyl group having a carbon atom number of 3 to 6. Examples of the alkyl group having a carbon atom number of 1 to 10 may include methyl, ethyl, propyl, butyl, pentyl, hexyl, heptyl, octyl, nonyl, and decanyl, as well as cyclopropyl, cyclobutyl, cyclopentyl, and cyclohexyl. Examples of the alkyl group having a carbon atom number of 1 to 4 may include methyl, ethyl, propyl, and butyl. In the case where isomeric forms are present, all isomeric forms are included. For example, butyl may include n-butyl, isobutyl, and tert-butyl.

Exemplary bromine-containing silane coupling agents may be SIB1906.0, SIB1894.2, and SIB1879.7 from Gelest.

The molecular structural formulae of SIB1906.0, SIB1894.2, and SIB1879.7 are represented by formula (6), formula (7), and formula (8), respectively:

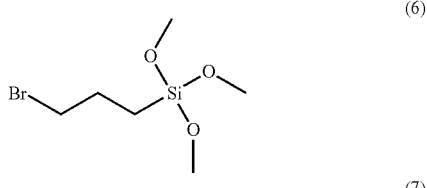

(6)

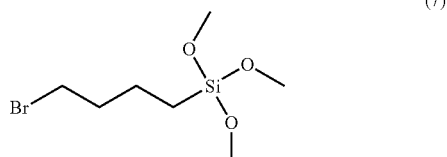

(7)

-continued

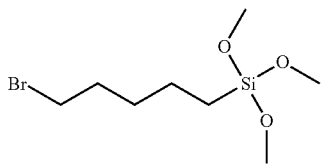
(8)

Chemical treatment may include, for example, treatment with an alkaline liquor and surface chemical modification treatment.

The hollow borosilicate microspheres with surfaces treated with a bromine-containing silane coupling agent may have an average particle diameter of no greater than 50 μm.

The hollow borosilicate microspheres with surfaces treated with a bromine-containing silane coupling agent are used as a filler in the thermosetting resin composition. The prepreg may be produced from the thermosetting resin composition.

The hollow borosilicate microspheres with surfaces treated with a bromine-containing silane coupling agent has an average particle diameter of no greater than about 50 μm. If the hollow borosilicate microspheres with surfaces treated with a bromine-containing silane coupling agent has an average particle diameter of greater than about 50 μm, the particle size of the filler in a thin prepreg will exceed the thickness of the prepreg, leading to a problem that the filler is exposed and the reliability of the laminate is impacted.

With respect to 100 parts by weight of the sum of the thermosetting polyphenylene ether resin, the unsaturated polyolefin resin, and the curing agent, the hollow borosilicate microspheres with surfaces treated with a bromine-containing silane coupling agent are 10 to 60 parts by weight, preferably 20 to 50 parts by weight.

Thermosetting Polyphenylene Ether Resin

In the thermosetting resin composition, thermosetting polyphenylene ether resin the thermosetting polyphenylene ether resin is represented by the following formula (1):

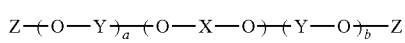
(1)

in formula (1), a and b are each independently an integer of 1 to 30,

Z is a group represented by formula (2) or (3)

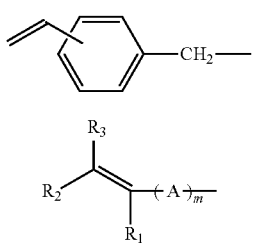
(2)

(3)

in formula (3), A is an aryl group having a carbon atom number of 6 to 30, a carbonyl group, or an alkylene having a carbon atom number of 1 to 10, m is an integer of 0 to 10, and $R_1$ to $R_3$ are each independently a hydrogen atom or an alkyl group having a carbon atom number of 1 to 10;

—(—O—Y—)— in formula (1) is a group represented by formula (4):

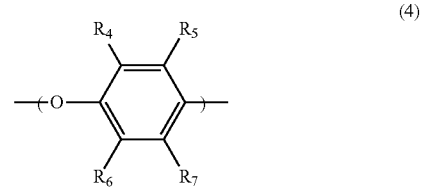
(4)

in formula (4), $R_4$ and $R_6$ are each independently a hydrogen atom, a halogen atom, an alkyl having a carbon atom number of 1 to 10 or phenyl group; and $R_5$ and $R_7$ are each independently a hydrogen atom, a halogen atom, an alkyl having a carbon atom number of 1 to 10 or phenyl group;

—(—O—X—O—)— in formula (1) is a group represented by formula (5):

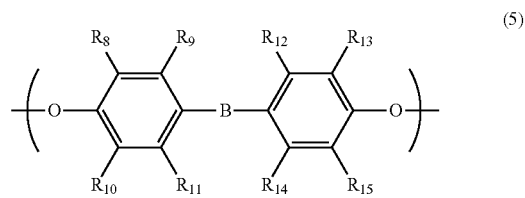
(5)

in formula (5), $R_8$, $R_9$, $R_{10}$, $R_{11}$, $R_{12}$, $R_{13}$, $R_{14}$ and $R_{15}$ are each independently a hydrogen atom, a halogen atom, an alkyl having a carbon atom number of 1 to 10 or phenyl group; and B is an arylene group having a carbon atom number of 6 to 30, an alkylene group having a carbon atom number of 1 to 10, —O—, —CO—, —SO—, —CS—, or —$SO_2$—.

The alkyl group having a carbon atom number of 1 to 10 is preferably an alkyl group having a carbon atom number of 1 to 6, still more preferably an alkyl group having a carbon atom number of 1 to 4. Examples of the alkyl group having a carbon atom number of 1 to 8 may include methyl, ethyl, propyl, butyl, pentyl, hexyl, heptyl, and octyl, as well as cyclopropyl, cyclobutyl, cyclopentyl, and cyclohexyl. In the case where isomeric forms are present, all isomeric forms are included. For example, butyl may include n-butyl, isobutyl, and tert-butyl.

Examples of the arylene group having a carbon atom number of 6 to 30 may include phenylene, naphthylene, and anthracenylene.

The alkylene group having a carbon atom number of 1 to 10 is preferably an alkylene group having a carbon atom number of 1 to 8, more preferably an alkylene group having a carbon atom number of 1 to 6, still more preferably an alkylene group having a carbon atom number of 1 to 4. Examples of the alkylene group having a carbon atom number of 1 to 10 may include methylene, ethylene, propylene, butylene, pentylene, hexylene, heptylene, octylene, nonylene, and decanylene, as well as cyclopropylene, cyclobutylene, cyclopentylene, and cyclohexylene. In the case where isomeric forms are present, all isomeric forms are included.

Examples of the halogen atom may include a fluorine atom, a chlorine atom, a bromine atom and an iodine atom.

Preferably, the thermosetting polyphenylene ether resin may have a number average molecular weight of 500-10000 g/mol, preferably 800 to 8000 g/mol, further preferably 1000 to 7000 g/mol.

An exemplary thermosetting polyphenylene ether may be a polyphenylene ether modified with an methacrylate group, SA9000, from Sabic.

Unsaturated Polyolefin Resin

In the thermosetting resin composition, the unsaturated polyolefin resin may be selected from one of a styrene-butadiene copolymer, polybutadiene, and a styrene-butadiene-divinylbenzene copolymer or a mixture of at least two thereof. In the thermosetting resin composition, the unsaturated polyolefin resin is used as a crosslinking agent of the thermosetting polyphenylene ether resin.

The unsaturated polyolefin resin may have a number average molecular weight of 1000 to 20000 g/mol.

An exemplary unsaturated polyolefin resin may be a styrene-butadiene copolymer, Ricon100, from Samtomer, or a polybutadiene, B-1000 from Soda, Japan.

An exemplary unsaturated polyolefin resin may be a styrene-butadiene copolymer, Ricon181, from Samtomer, or a polybutadiene, B-3000 from Soda, Japan.

The unsaturated polyolefin resin is 25 to 250 parts by weight with respect to 100 parts by weight of the thermosetting polyphenylene ether resin.

Curing Agent

In the thermosetting resin composition, the curing agent may be a radical curing agent.

The radical curing agent may be selected from organic peroxide curing agents.

The organic peroxide curing agent may be selected from any one or a mixture of at least two of dicumyl peroxide, dilauroyl peroxide, isopropylphenyl peroxyneodecanoate, tert-butyl peroxyneodecanoate, tert-pentyl peroxypivalate, tert-butyl peroxypivalate, tert-butyl peroxyisobutanoate, tert-butyl peroxy-3,5,5-trimethylhexanoate, tert-butyl peroxyacetate, tert-butyl peroxybenzoate, 1,1-di-tert-butylperoxy-3,5,5-trimethylcyclohexane, 1,1-di-tert-butylperoxycyclohexane, 2,2-bis(tert-butylperoxy)butane, bis(4-tert-butylcyclohexyl)peroxydicarbonate, hexadecyl peroxydicarbonate, tetradecyl peroxydicarbonate, di-tert-pentyl peroxide, dicumyl peroxide, bis(tert-butylperoxyisopropyl)benzene, 2,5-dimethyl-2,5-di-tert-butylperoxyhexane, 2,5-dimethyl-2,5-di-tert-butylperoxyhexyne, dicumyl hydroperoxide, tert-pentyl hydroperoxide, tert-butyl hydroperoxide, tert-butyl peroxycarbonate-2-ethylhexanoate, 2-ethylhexyl tert-butylperoxycarbonate, n-butyl 4,4-bis(tert-butylperoxy)pentanoate, methyl ethyl ketone peroxide, and cyclohexane peroxide.

The curing agent is 1 to 3 parts by weight with respect to 100 parts by weight of the sum of the thermosetting polyphenylene ether resin and the unsaturated polyolefin resin.

An exemplary organic peroxide curing agent is selected from DCP of Shanghai Gaoqiao.

The thermosetting resin composition described above may further comprise a non-hollow inorganic filler.

The non-hollow inorganic filler may be selected from one or more of crystalline silica, fused silica, spherical silica, boron nitride, aluminum hydroxide, titanium dioxide, strontium titanate, barium titanate, aluminum oxide, magnesium oxide, barium sulfate, and talc.

With respect to 100 parts by weight of the sum of the thermosetting polyphenylene ether resin and the unsaturated polyolefin resin crosslinking agent, the non-hollow inorganic filler is 150-250 parts by weight.

An exemplary non-hollow filler is selected from DQ2028L of Jiangsu Lianrui.

An exemplary non-hollow filler is selected from SC2050-SVJ of Adematacs.

The thermosetting resin composition may further comprise a bromine-containing flame retardant so as to improve the flame retardancy of the laminate produced therefrom.

The bromine-containing flame retardant may be selected from one of decabromodiphenyl ether, decabromodiphenyl ethane, and ethylene-bis(tetrabromophthalimide) or a mixture of at least two thereof.

With respect to 100 parts by weight of the thermosetting polyphenylene ether resin and the unsaturated polyolefin resin crosslinking agent, the bromine-containing flame retardant may be 15-25 parts by weight.

An exemplary bromine-containing flame retardant may be BT-93W from Albemarle, United States.

The thermosetting resin composition may further comprise silane coupling agents or/and wetting dispersants. These silane coupling agents are not particularly limited, as long as they are silane coupling agents typically used in surface treatment. As specific examples, amino silanes such as γ-aminopropyltriethoxysilane, N-β-(aminoethyl)-Y-aminopropyltrimethoxysilane, and the like, epoxysilanes such as γ-glycidyloxypropyltrimethoxysilane and the like, vinylsilanes such as γ-methylacryloxypropyltrimethoxysilane and the like, and anionic silanes such as N-β-(N-vinylbenzilaminoethyl)-γ-aminopropyltrimethoxysilane hydrochloride, phenylsilanes, and the like may be exemplified. One or at least two appropriately used in combination thereof may be selected. Furthermore, the wetting dispersants are not particularly limited, as long as they are wetting dispersants used in setting resin compositions. Wetting dispersants such as Disperbyk-110, 111, 180, 161, BYK-W996, W9010, W903, and the like, for example produced by BYK Chemie Japan, may be exemplified.

The thermosetting resin composition may further contain various additives. As specific examples, a flame retardant, an antioxidant, a heat stabilizer, an antistatic agent, an ultraviolet absorbent, a pigment, a colorant, a lubricant, and the like may be exemplified. These additives may be used alone, or may be used by mixing two or more thereof.

The solvent used in a gum solution produced from the thermosetting resin composition in this disclosure is not particularly limited. As specific examples, alcohols such as methanol, ethanol, butanol, and the like, ethers such as ethyl cellosolve, butyl cellosolve, ethylene glycol-methyl ether, carbitol, butyl carbitol, and the like, ketones such as acetone, butanone, methyl ethyl ketone, methyl isobutyl ketone, cyclohexanone, and the like, aromatic hydrocarbons such as toluene, xylene, mesitylene, and the like, esters such as ethoxyethyl acetate, ethyl acetate, and the like, and nitrogen-containing solvents such as N,N-dimethylformamide, N,N-dimethylacetamide, N-methyl-2-pyrrolidone, and the like may be exemplified. The solvent described above may be used alone, or may be used by mixing two or more thereof. It is preferable that aromatic hydrocarbon solvents such as toluene, xylene, mesitylene, and the like and ketone solvents such as acetone, butanone, methyl ethyl ketone, methyl isobutyl ketone, cyclohexanone, and the like are mixed and used. The usage amount of the solvent may be selected by those skilled in the art according to the experience of their own, as long as the resin gum solution obtained is allowed to reach a viscosity suitable for use. More preferably, the solvent is toluene.

As for a production method of the thermosetting resin composition of this disclosure, production may be performed by a well-known method such as compounding, stirring, and mixing various components of the thermosetting resin composition.

The production of a high-speed electronic circuit substrate by using the thermosetting resin composition described above comprises the steps of:

Adding a thermosetting polyphenylene ether resin, an unsaturated polyolefin resin, a curing agent, hollow borosilicate microspheres with surfaces treated with a bromine-containing silane coupling agent, and a non-hollow inorganic filler to an appropriate amount of solvent, uniformly dispersing them with stirring, so that solid components therein are uniformly dispersed in a gum solution; soaking a glass fiber cloth with the gum solution produced, and performing sheet baking in an oven at a suitable temperature for a certain period to remove the solvent and form a semi-cured sheet; neatly overlapping several semi-cured sheets, providing metal foils such as copper foils on the top and the bottom; and performing lamination and curing in a press so as to obtain a high-speed electronic circuit substrate.

This disclosure may also provide a prepreg, comprising a reinforcing material and the thermosetting resin composition according to any one described above attached thereon after impregnation and drying.

Examples of the reinforcing material may include glass fiber cloths. In the description below, the glass fiber cloth reinforcing material and the glass fiber cloth may be interchangeably used.

Particularly, the thermosetting resin composition are formulated into a gum solution by dispersion by mechanical stirring, emulsification, or ball milling, and then a glass fiber cloth is soaked with this gum solution to obtain a prepreg by drying. A laminate may be produced by heat-pressing this prepreg and metal foils such as copper foils in a vacuum press.

This disclosure may also provide a laminate and a printed circuit board.

The laminate may contain at least sheet of the prepreg of any one described above. For example, the laminate is a metal foil-clad laminate. The metal foil-clad laminate comprises: a sheet of the prepreg as described above and a metal foil clad on one side or both sides of the prepreg; or at least two sheets of laminated prepregs and a metal foil clad on one side or both sides of the laminated prepregs, wherein at least one sheet of the at least two sheets of the laminated prepregs is the prepreg as described above, or preferably each sheet of the at least two sheets of the laminated prepregs is the prepreg as described above.

The printed circuit board may contain at least sheet of the prepreg of any one described above.

The prepreg is laminated between metal foils such as copper foils, and a laminate (i.e., a copper clad laminate) may be produced after heat pressing.

According to this disclosure, there may be provided a thermosetting resin composition, a prepreg, a laminate, and a printed circuit board. By adding hollow borosilicate microspheres with surfaces treated with a bromine-containing silane coupling agent to a thermosetting resin composition comprising a thermosetting polyphenylene ether resin and an unsaturated polyolefin resin, it is possible to allow the distribution of the bromine element in the resin system to be more uniform and improve the flame retarding efficiency. Therefore, in the case where the V-0 flame retardancy of the substrate is achieved, it is possible to reduce the proportion of bromine-containing flame retardant used and improve the peeling strength of the substrate so as to satisfy the requirements for the peeling strength of the substrate by customers. Furthermore, by performing surface treatment on hollow borosilicate microspheres with a bromine-containing silane coupling agent, it is possible to reduce the water absorption rate of the hollow borosilicate microspheres and the problem that the dielectric loss of the substrate produced is increased due to the water absorption of the hollow borosilicate microspheres will not occur.

Furthermore, the hollow borosilicate microspheres used are fillers which are not treated with an alkaline liquor, so that the procedure of treatment with an alkaline liquor in the production process of the hollow borosilicate microspheres is reduced, the production efficiency is improved, and the production process is more environmentally friendly.

Technical solutions of this disclosure will be further illustrated by specific Examples below. In the Examples and Comparative Examples below, the percentage, the ratio, and the like are based on weight, unless specifically indicated.

PREPARATION EXAMPLES

Preparation Example 1

Production of Hollow Borosilicate Microspheres SY-1 Treated with Bromine-Containing Silane Coupling Agent 100 g of hollow borosilicate microspheres iM16K with unmodified surfaces were added to a high-speed mixer with the temperature set to be 100° C. and preheated them for 5 min, then 5 g of a bromine-containing silane coupling agent SIB1906.0 was added thereto, and they were stirred for 30 min Stirring was stopped, and the temperature was maintained for 20 min, followed by cooling to room temperature, to obtain 103 g of hollow borosilicate microspheres SY-1 treated with a bromine-containing silane coupling agent. Here, a content of the chemically untreated hollow borosilicate microspheres iM16K was 97.5% by weight with respect to the hollow borosilicate microspheres SY-1 with surfaces treated with a bromine-containing silane coupling agent. This value was obtained by testing the ash content of the hollow borosilicate microspheres SY-1 with surfaces treated with a bromine-containing silane coupling agent. The specific testing method was a TGA method, wherein the temperature was increased to 700° C. at 10° C./min to obtain a TGA curve and the residual amount corresponding to 700° C. was this value.

Preparation Example 2

Production of Hollow Borosilicate Microspheres SY-2 Treated with Bromine-Containing Silane Coupling Agent 100 g of hollow borosilicate microspheres iM16K with unmodified surfaces were added to a high-speed mixer with the temperature set to be 100° C. and preheated them for 5 min, 6 g of a bromine-containing silane coupling agent SIB1894.2 was added thereto, and they were stirred for 30 min. Stirring was stopped, and the temperature was maintained for 20 min, followed by cooling to room temperature, to obtain 104 g of hollow borosilicate microspheres SY-2 treated with a bromine-containing silane coupling agent. Here, a content of the chemically untreated hollow borosilicate microspheres iM16K was 96.5% by weight with respect to the hollow borosilicate microspheres SY-2 with surfaces treated with a bromine-containing silane coupling agent. This value was obtained by testing the ash content of the hollow borosilicate microspheres SY-2 with surfaces treated with a bromine-containing silane coupling agent. The specific testing method was a TGA method, wherein the temperature was increased to 700° C. at 10° C./min to obtain a TGA curve and the residual amount corresponding to 700° C. was this value.

Preparation Example 3

Production of Hollow Borosilicate Microspheres SY-3 Treated with Bromine-Containing Silane Coupling Agent 100 g of hollow borosilicate microspheres iM16K with unmodified surfaces were added to a high-speed mixer with the temperature set to be 100° C. and preheated them for 5 min, 7 g of a bromine-containing silane coupling agent SIB1879.7 was added thereto, and they were stirred for 30 min. Stirring was stopped, and the temperature was maintained for 20 min, followed by cooling to room temperature, to obtain 105 g of hollow borosilicate microspheres SY-3 treated with a bromine-containing silane coupling agent. Here, a content of the chemically untreated hollow borosilicate microspheres iM16K was 95.5% by weight with respect to the hollow borosilicate microspheres SY-3 with surfaces treated with a bromine-containing silane coupling agent. This value was obtained by testing the ash content of the hollow borosilicate microspheres SY-3 with surfaces treated with a bromine-containing silane coupling agent. The specific testing method was a TGA method, wherein the temperature was increased to 700° C. at 10° C./min to obtain a TGA curve and the residual amount corresponding to 700° C. was this value.

Preparation Example 4

Production of Hollow Borosilicate Microspheres SY-4 Treated with Bromine-Containing Silane Coupling Agent 100 g of hollow borosilicate microspheres S38HS with unmodified surfaces were added to a high-speed mixer with the temperature set to be 100° C. and preheated them for 5 min, then 5 g of a bromine-containing silane coupling agent SIB1906.0 was added thereto, and they were stirred for 30 min Stirring was stopped, and the temperature was maintained for 20 min, followed by cooling to room temperature, to obtain 103 g of hollow borosilicate microspheres SY-4 treated with a bromine-containing silane coupling agent. Here, a content of the chemically untreated hollow borosilicate microspheres S38HS was 97.5% by weight with respect to the hollow borosilicate microspheres SY-4 with surfaces treated with a bromine-containing silane coupling agent. This value was obtained by testing the ash content of the hollow borosilicate microspheres SY-4 with surfaces treated with a bromine-containing silane coupling agent. The specific testing method was a TGA method, wherein the temperature was increased to 700° C. at 10° C./min to obtain a TGA curve and the residual amount corresponding to 700° C. was this value.

Preparation Example 5

Production of Hollow Borosilicate Microspheres SY-5 Treated with Bromine-Containing Silane Coupling Agent 100 g of hollow borosilicate microspheres S38HS with unmodified surfaces were added to a high-speed mixer with the temperature set to be 100° C. and preheated them for 5 min, 6 g of a bromine-containing silane coupling agent SIB1894.2 was added thereto, and they were stirred for 30 min. Stirring was stopped, and the temperature was maintained for 20 min, followed by cooling to room temperature, to obtain 104 g of hollow borosilicate microspheres SY-5 treated with a bromine-containing silane coupling agent. Here, a content of the chemically untreated hollow borosilicate microspheres S38HS was 96.5% by weight with respect to the hollow borosilicate microspheres SY-5 with surfaces treated with a bromine-containing silane coupling agent. This value was obtained by testing the ash content of the hollow borosilicate microspheres SY-5 with surfaces treated with a bromine-containing silane coupling agent. The specific testing method was a TGA method, wherein the temperature was increased to 700° C. at 10° C./min to obtain a TGA curve and the residual amount corresponding to 700° C. was this value.

Preparation Example 6

Production of Hollow Borosilicate Microspheres SY-6 Treated with Bromine-Containing Silane Coupling Agent 100 g of hollow borosilicate microspheres S38HS with unmodified surfaces were added to a high-speed mixer with the temperature set to be 100° C. and preheated them for 5 min, 7 g of a bromine-containing silane coupling agent SIB1879.7 was added thereto, and they were stirred for 30 min. Stirring was stopped, and the temperature was maintained for 20 min, followed by cooling to room temperature, to obtain 105 g of hollow borosilicate microspheres SY-6 treated with a bromine-containing silane coupling agent. Here, a content of the chemically untreated hollow borosilicate microspheres S38HS was 95.5% by weight with respect to the hollow borosilicate microspheres SY-6 with surfaces treated with a bromine-containing silane coupling agent. This value was obtained by testing the ash content of the hollow borosilicate microspheres SY-6 with surfaces treated with a bromine-containing silane coupling agent. The specific testing method was a TGA method, wherein the temperature was increased to 700° C. at 10° C./min to obtain a TGA curve and the residual amount corresponding to 700° C. was this value.

EXAMPLES

In Examples of this disclosure, raw materials selected for producing a high-speed electronic circuit substrate were as shown in the following Table.

TABLE 1

| Manufacturer | Name or model of product | Description of material |
|---|---|---|
| Sabic | SA9000 | Thermosetting polyphenylene ether resin |
| Samtomer | Ricon100 | Styrene-butadiene copolymer |
| Samtomer | Ricon181 | Styrene-butadiene copolymer |
| Soda, Japan | B-1000 | Polybutadiene resin |
| Soda, Japan | B-3000 | Polybutadiene resin |
| Shanghai Gaoqiao | DCP | Dicumyl peroxide |
| Jiangsu Lianrui | DQ1028L | Fused silicon micropowder, average particle diameter: 3.0 μm |
| Adematacs | SC2050-SVJ | Fused silicon micropowder, average particle diameter: 0.5 μm |
| Albemarle, United States | BT-93W | Bromine-containing flame retardant |
| 3M | iM16K | Hollow borosilicate microspheres which are not subjected to surface treatment and alkaline liquor treatment, average particle diameter: 20 μm |
| 3M | S38HS | Hollow borosilicate microspheres which are not subjected to surface treatment and alkaline liquor treatment, average particle diameter: 44 μm |
| Preparation Example 1 | SY-1 | Hollow borosilicate microspheres treated with bromine-containing silane coupling agent |
| Preparation Example 2 | SY-2 | Hollow borosilicate microspheres treated with bromine-containing silane coupling agent |
| Preparation Example 3 | SY-3 | Hollow borosilicate microspheres treated with bromine-containing silane coupling agent |
| Preparation Example 4 | SY-4 | Hollow borosilicate microspheres treated with bromine-containing silane coupling agent |
| Preparation Example 5 | SY-5 | Hollow borosilicate microspheres treated with bromine-containing silane coupling agent |
| Preparation Example 6 | SY-6 | Hollow borosilicate microspheres treated with bromine-containing silane coupling agent |
| Shanghai Honghe | 1078 | Glass fiber cloth |

Example 1

50 g of a modified thermosetting polyphenylene ether resin SA9000, 50 g of a styrene-butadiene copolymer Ricon100, 3.0 g of a curing agent DCP, 20 g of a bromine-containing flame retardant BT-93W, 30 g of hollow borosilicate microspheres SY-1 treated with a bromine-containing silane coupling agent, and 180 g of a fused silicon micropowder DQ1028L were dissolved in a toluene solvent, and the viscosity was adjusted 50 seconds, which was tested with a No. 4 viscosity cup, to obtain a gum. A 1078 glass fiber cloth was soaked with the gum and controlled to a weight of 190 g by a clamp shaft, sheet baking was performed in an oven, and the toluene solvent was removed to produce a 1078-prepreg. Six sheets of 1078-prepregs were laminated, and copper foils having a thickness of 1 OZ were provided on the top and the bottom surfaces, followed by lamination and curing under vacuum in a press for 90 min in which the curing pressure was 25 Kg/cm$^2$ and the curing temperature was 180° C., to produce a copper clad laminate (a high-speed electronic circuit substrate). The physical properties of the copper clad laminate (the high-speed electronic circuit substrate) produced were measured. Components and usage amounts of the composition, and physical properties were as shown in Table 2.

Examples 2-26 and Comparative Examples 1-8

Copper clad laminates (high-speed electronic circuit substrates) of Preparation Examples 2-26 and Comparative Examples 1-8 were produced in the same manner as that of Example 1, except that components and usage amounts of the composition and physical properties were as shown in each of Tables 2-6, respectively.

TABLE 2

| Component | Example 1 | Example 2 | Example 3 | Example 4 | Example 5 | Example 6 | Example 7 |
|---|---|---|---|---|---|---|---|
| SA9000 | 50 | 50 | 50 | 80 | 30 | 50 | 50 |
| Ricon100 | 50 | 50 | 50 | 20 | 70 | 50 | 50 |
| DCP | 3.0 | 3.0 | 3.0 | 2.0 | 1.0 | 2.0 | 3.0 |
| BT-93W | 20 | 20 | 20 | 20 | 20 | 15 | 25 |
| SY-1 | 30 | 0 | 0 | 30 | 30 | 30 | 30 |
| SY-2 | 0 | 30 | 0 | 0 | 0 | 0 | 0 |
| SY-3 | 0 | 0 | 30 | 0 | 0 | 0 | 0 |
| DQ1028L | 180 | 180 | 180 | 180 | 180 | 180 | 180 |
| Property | | | | | | | |
| Dk(10G) | 3.0 | 3.0 | 3.0 | 3.2 | 2.8 | 3.0 | 3.0 |
| Df(10G) | 0.0031 | 0.0030 | 0.0030 | 0.0050 | 0.0025 | 0.0030 | 0.0030 |
| Flame retardancy | V-0 | V-0 | V-0 | V-0 | V-0 | V-0 | V-0 |
| Peeling strength (N/mm) | 1.0 | 1.0 | 1.0 | 1.2 | 0.8 | 1.0 | 1.0 |
| Water absorption rate (%) | 0.11 | 0.12 | 0.10 | 0.13 | 0.09 | 0.12 | 0.11 |

TABLE 3

| Component | Example 8 | Example 9 | Example 10 | Example 11 | Example 12 | Example 13 |
|---|---|---|---|---|---|---|
| SA9000 | 50 | 50 | 50 | 50 | 50 | 50 |
| Ricon181 | 50 | 50 | 50 | 50 | 50 | 50 |
| DCP | 3.0 | 3.0 | 3.0 | 3.0 | 3.0 | 3.0 |
| BT-93W | 20 | 20 | 20 | 20 | 20 | 20 |
| SY-1 | 20 | 0 | 0 | 30 | 0 | 0 |
| SY-2 | 0 | 40 | 0 | 0 | 30 | 0 |
| SY-3 | 0 | 0 | 60 | 0 | 0 | 30 |
| DQ1028L | 180 | 180 | 180 | 150 | 200 | 250 |
| Property | | | | | | |
| Dk(10G) | 3.2 | 2.8 | 2.6 | 2.9 | 3.1 | 3.2 |
| Df(10G) | 0.0031 | 0.0030 | 0.0030 | 0.0031 | 0.0030 | 0.0030 |
| Flame retardancy | V-0 | V-0 | V-0 | V-0 | V-0 | V-0 |
| Peeling strength (N/mm) | 1.0 | 1.1 | 1.0 | 1.1 | 1.0 | 0.9 |
| Water absorption rate (%) | 0.11 | 0.12 | 0.10 | 0.11 | 0.12 | 0.10 |

TABLE 4

| Component | Example 14 | Example 15 | Example 16 | Example 17 | Example 18 | Example 19 | Example 20 |
|---|---|---|---|---|---|---|---|
| SA9000 | 50 | 50 | 50 | 80 | 30 | 50 | 50 |
| B-1000 | 50 | 50 | 50 | 20 | 70 | 50 | 50 |
| DCP | 3.0 | 3.0 | 3.0 | 2.0 | 1.0 | 2.0 | 3.0 |
| BT-93W | 20 | 20 | 20 | 20 | 20 | 15 | 25 |
| SY-4 | 30 | 0 | 0 | 30 | 30 | 30 | 30 |
| SY-5 | 0 | 30 | 0 | 0 | 0 | 0 | 0 |
| SY-6 | 0 | 0 | 30 | 0 | 0 | 0 | 0 |
| SC2050-SVJ | 180 | 180 | 180 | 180 | 180 | 180 | 180 |
| Property | | | | | | | |
| Dk(10G) | 3.0 | 2.9 | 3.1 | 3.2 | 2.8 | 3.1 | 3.0 |
| Df(10G) | 0.0031 | 0.0030 | 0.0032 | 0.0050 | 0.0025 | 0.0031 | 0.0030 |
| Flame retardancy | V-0 | V-0 | V-0 | V-0 | V-0 | V-0 | V-0 |
| Peeling strength (N/mm) | 1.1 | 1.0 | 1.0 | 1.2 | 1.1 | 1.0 | 1.1 |
| Water absorption rate (%) | 0.11 | 0.12 | 0.11 | 0.13 | 0.08 | 0.12 | 0.12 |

TABLE 5

| Component | Example 21 | Example 22 | Example 23 | Example 24 | Example 25 | Example 26 |
|---|---|---|---|---|---|---|
| SA9000 | 50 | 50 | 50 | 50 | 50 | 50 |
| B-3000 | 50 | 50 | 50 | 50 | 50 | 50 |
| DCP | 3.0 | 3.0 | 3.0 | 3.0 | 3.0 | 3.0 |
| BT-93W | 20 | 20 | 20 | 20 | 20 | 20 |
| SY-4 | 20 | 0 | 0 | 30 | 0 | 0 |
| SY-5 | 0 | 40 | 0 | 0 | 30 | 0 |
| SY-6 | 0 | 0 | 60 | 0 | 0 | 30 |
| SC2050-SVJ | 180 | 180 | 180 | 150 | 200 | 250 |
| Property | | | | | | |
| Dk(10G) | 3.1 | 2.9 | 2.6 | 3.0 | 3.1 | 3.2 |
| Df(10G) | 0.0031 | 0.0031 | 0.0030 | 0.0031 | 0.0031 | 0.0030 |
| Flame retardancy | V-0 | V-0 | V-0 | V-0 | V-0 | V-0 |
| Peeling strength (N/mm) | 1.0 | 1.1 | 1.0 | 1.2 | 1.1 | 1.0 |
| Water absorption rate (%) | 0.11 | 0.13 | 0.10 | 0.12 | 0.12 | 0.11 |

TABLE 6

| Component | Comparative Example 1 | Comparative Example 2 | Comparative Example 3 | Comparative Example 4 | Comparative Example 5 | Comparative Example 6 | Comparative Example 7 | Comparative Example 8 |
|---|---|---|---|---|---|---|---|---|
| SA9000 | 50 | 80 | 30 | 50 | 50 | 50 | 50 | 50 |
| Ricon100 | 50 | 20 | 70 | 50 | 50 | 0 | 0 | 0 |
| B-1000 | 0 | 0 | 0 | 0 | 0 | 50 | 50 | 50 |
| DCP | 3.0 | 3.0 | 3.0 | 3.0 | 3.0 | 3.0 | 3.0 | 3.0 |
| BT-93W | 20 | 20 | 20 | 25 | 30 | 20 | 25 | 30 |
| iM16K | 30 | 30 | 30 | 30 | 30 | 0 | 0 | 0 |
| S38HS | 0 | 0 | 0 | 0 | 0 | 30 | 30 | 30 |
| DQ1028L | 180 | 180 | 180 | 180 | 180 | 0 | 0 | 0 |
| SC2050-SVJ | 0 | 0 | 0 | 0 | 0 | 180 | 180 | 180 |
| Property | | | | | | | | |
| Dk(10G) | 3.0 | 3.2 | 2.8 | 3.0 | 3.0 | 3.0 | 3.1 | 3.1 |
| Df(10G) | 0.0030 | 0.0050 | 0.0028 | 0.0030 | 0.0030 | 0.0030 | 0.0033 | 0.0031 |
| Flame retardancy | V-1 | V-1 | V-1 | V-1 | V-0 | V-1 | V-1 | V-0 |
| Peeling strength (N/mm) | 1.0 | 1.2 | 0.8 | 1.0 | 0.5 | 1.0 | 0.9 | 0.48 |
| Water absorption rate (%) | 0.20 | 0.22 | 0.20 | 0.21 | 0.20 | 0.21 | 0.23 | 0.21 |

The methods for testing the properties described above were as follows.

(1) Test method of Dk/Df: an IPC-TM-650 2.5.5.5 standard method was used with a frequency of 10 GHz.

(2) Test method of flame retardancy: a test was performed according to the UL94 "50 W (20 mm) vertical burning test: V-0, V-1, and V-2" test method, and V-0 is determined to be flame retardant.

(3) Test method of peeling strength: it referred to a tensile force required for peeling a millimeter of a copper foil from a copper-clad plate at room temperature.

(4) Test method of water absorption rate: an IPC-TM-650 2.6.2.1 standard method was used.

(5) Particle size: Malvern laser method.

(6) Number average molecular weight: a GPC test method in which a GB T21863-2008 gel permeation chromatography method (GPC) was used and tetrahydrofuran was used as an eluent.

Analysis of Physical Properties

As can be known from Examples 1-26, the hollow microspheres modified with a bromine-containing flame retardant was used in the substrate produced, and the overall properties including the dielectric constant, the dielectric loss, the flame retardancy, the peeling strength, and the water absorption rate of the substrate were excellent and the requirements for overall properties of the substrate by customers could be satisfied.

By comparing Comparative Example 1 to Examples 1, 2, and 3, comparing Comparative Example 2 to Example 4, and comparing Comparative Example 3 to Example 5, the substrates produced could not achieve V-0 flame retardancy and the water absorption rate of the substrate increased, with respect to a resin system in which hollow microspheres modified with a bromine-containing silane coupling agent were not used.

As can be known from the comparison between Comparative Example 4 and Example 7, the substrate produced still could not achieve V-0 flame retardancy and the water absorption rate of the substrate increased as the usage amount of the bromine-containing flame retardant increased from 20 parts by weight in Comparative Example 1 to 25 parts by weight in Comparative Example 4, with respect to a resin system in which hollow microspheres modified with a bromine-containing silane coupling agent were not used.

As can be known from the comparison between Comparative Example 5 and Example 7, the substrate produced achieved V-0 flame retardancy as the usage amount of the bromine-containing flame retardant increased from 20 parts by weight in Comparative Example 1 to 30 parts by weight in Comparative Example 5, with respect to a resin system in which hollow microspheres modified with a bromine-containing silane coupling agent were not used. However, the PS of the substrate produced decreased from 1.0 N/mm to 0.5 N/mm and the water absorption rate of the substrate increased due to high usage amount of the flame retardant.

By comparing Comparative Example 6 to Examples 14, 15, and 16, the substrates produced could not achieve V-0 flame retardancy and the water absorption rate of the substrate increased, with respect to a resin system in which hollow microspheres modified with a bromine-containing silane coupling agent were not used.

As can be known from the comparison between Comparative Example 7 and Example 20, the substrate produced still could not achieve V-0 flame retardancy and the water absorption rate of the substrate increased as the usage amount of the bromine-containing flame retardant increased from 20 parts by weight in Comparative Example 6 to 25 parts by weight in Comparative Example 7, with respect to a resin system in which hollow microspheres modified with a bromine-containing silane coupling agent were not used.

As can be known from the comparison between Comparative Example 8 and Example 20, the substrate produced achieved V-0 flame retardancy as the usage amount of the bromine-containing flame retardant increased from 20 parts by weight in Comparative Example 6 to 30 parts by weight in Comparative Example 8, with respect to a resin system in which hollow microspheres modified with a bromine-containing silane coupling agent were not used. However, the PS of the substrate produced decreased from 1.0 N/mm to 0.49 N/mm and the water absorption rate of the substrate increased due to high usage amount of the flame retardant.

Obviously, various modifications and variations may be made to the Examples of this disclosure by the person skilled in the art without deviating from the spirit and the scope of this disclosure. Thus, if these modifications and variations of this disclosure are within the scope of this disclosure according to the claims and equivalent techniques thereof, this disclosure also intends to encompass these modifications and variations.

What is claimed is:

1. A thermosetting resin composition, comprising the following components:
   (1) a thermosetting polyphenylene ether resin;
   (2) an unsaturated polyolefin resin;
   (3) a curing agent; and
   (4) hollow borosilicate microspheres with surfaces treated with a bromine-containing silane coupling agent,
   wherein the bromine-containing silane coupling agent is represented by formula $(BrR_{21})Si(OR_{22})(OR_{23})(OR_{24})$, wherein $R_{21}$ represents an alkyl group having a carbon atom number of 1 to 10, and $R_{22}$, $R_{23}$, and $R_{24}$ each independently represent an alkyl group having a carbon atom number of 1 to 4.

2. The thermosetting resin composition of claim 1, wherein the hollow borosilicate microspheres with surfaces treated with a bromine-containing silane coupling agent are not treated with an alkaline liquor.

3. The thermosetting resin composition of claim 1, wherein the hollow borosilicate microspheres with surfaces treated with a bromine-containing silane coupling agent are obtained by treating chemically untreated hollow borosilicate microspheres with a bromine-containing silane coupling agent, wherein a content of the chemically untreated hollow borosilicate microspheres is 95% to 98% by weight with respect to the hollow borosilicate microspheres with surfaces treated with a bromine-containing silane coupling agent.

4. The thermosetting resin composition of claim 1, wherein the hollow borosilicate microspheres with surfaces treated with a bromine-containing silane coupling agent have an average particle diameter of no greater than 50 μm.

5. The thermosetting resin composition of claim 1, wherein the hollow borosilicate microspheres with surfaces treated with a bromine-containing silane coupling agent are 10 to 60 parts by weight with respect to 100 parts by weight of the sum of the thermosetting polyphenylene ether resin and the unsaturated polyolefin resin.

6. The thermosetting resin composition of claim 1, wherein the unsaturated polyolefin resin is 25 to 250 parts by weight with respect to 100 parts by weight of the thermosetting polyphenylene ether resin.

7. The thermosetting resin composition of claim 1, wherein the curing agent is 1 to 3 parts by weight with respect to 100 parts by weight of the sum of the thermosetting polyphenylene ether resin and the unsaturated polyolefin resin.

8. The thermosetting resin composition of claim 1, wherein the thermosetting polyphenylene ether resin is represented by the following formula (1):

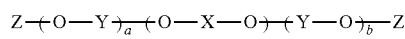
(1)

in formula (1), a and b are each independently an integer of 1 to 30,

Z is a group represented by formula (2) or (3)

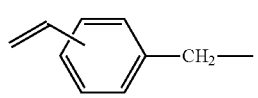
(2)

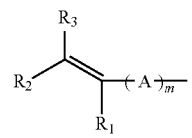
(3)

in formula (3), A is an arylene group having a carbon atom number of 6 to 30, a carbonyl group, or an alkylene having a carbon atom number of 1 to 10, m is an integer of 0 to 10, and $R_1$ to $R_3$ are each independently a hydrogen atom or an alkyl group having a carbon atom number of 1 to 10;

—(—O—Y—)— in formula (1) is a group represented by formula (4):

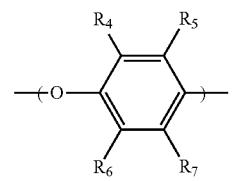
(4)

in formula (4), $R_4$ and $R_6$ are each independently a hydrogen atom, a halogen atom, an alkyl having a carbon atom number of 1 to 10 or phenyl group; and $R_5$ and $R_7$ are each independently a hydrogen atom, a halogen atom, an alkyl having a carbon atom number of 1 to 10 or phenyl group;

—(—O—X—O—)— in formula (1) is a group represented by formula (5):

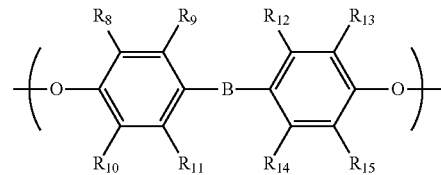
(5)

in formula (5), $R_8$, $R_9$, $R_{10}$, $R_{11}$, $R_{12}$, $R_{13}$, $R_{14}$ and $R_{15}$ are each independently a hydrogen atom, a halogen atom, an alkyl having a carbon atom number of 1 to 10 or phenyl group; and B is an alkylene group having a carbon atom number of 1 to 10, —O—, —CO—, —SO—, —CS—, or —SO$_2$—.

9. The thermosetting resin composition of claim 1, wherein the thermosetting polyphenylene ether resin has a number average molecular weight of 500-10000 g/mol.

10. The thermosetting resin composition of claim 1, wherein the unsaturated polyolefin resin is selected from one of a styrene-butadiene copolymer, polybutadiene, and a styrene-butadiene-divinylbenzene copolymer or a mixture of at least two thereof.

11. The thermosetting resin composition of claim 1, wherein the curing agent is a radical curing agent.

12. The thermosetting resin composition of claim 1, wherein the curing agent is an organic peroxide-based curing agent.

13. The thermosetting resin composition of claim 1, further comprising a bromine-containing flame retardant.

14. The thermosetting resin composition of claim 13, wherein the bromine-containing flame retardant is selected from one of decabromodiphenyl ether, decabromodiphenyl ethane, and ethylene-bis(tetrabromophthalimide) or a mixture of at least two thereof.

15. A prepreg, comprising a reinforcing material and the thermosetting resin composition according to claim 1 attached thereon after impregnation and drying.

16. A metal foil-clad laminate, comprising: a sheet of the prepreg according to claim 15 and a metal foil clad on one side or both sides of the prepreg; or at least two sheets of laminated prepregs and a metal foil clad on one side or both sides of the laminated prepregs, wherein at least one sheet of the at least two sheets of the laminated prepregs is the prepreg according to claim 15.

17. A printed circuit board, comprising at least one sheet of the prepreg according to claim 15.

* * * * *